(12) United States Patent
Forbes

(10) Patent No.: US 7,241,658 B2
(45) Date of Patent: Jul. 10, 2007

(54) VERTICAL GAIN CELL

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 330 days.

(21) Appl. No.: 10/931,545

(22) Filed: Aug. 31, 2004

(65) Prior Publication Data

US 2005/0032313 A1    Feb. 10, 2005

Related U.S. Application Data

(62) Division of application No. 10/379,478, filed on Mar. 4, 2003, now Pat. No. 6,956,256.

(51) Int. Cl.
*H01L 21/8242* (2006.01)
(52) U.S. Cl. ................. 438/242; 438/270; 257/E21.655
(58) Field of Classification Search ................. 438/242, 438/270, 272, 589; 257/E21.41, E21.655
See application file for complete search history.

(56) References Cited

U.S. PATENT DOCUMENTS

| 4,826,780 A | 5/1989 | Takemoto et al. ............ 437/37 |
| 4,970,689 A | 11/1990 | Kenney .................. 365/189.01 |
| 4,999,811 A | 3/1991 | Banerjee ...................... 365/149 |
| 5,006,909 A | 4/1991 | Kosa |
| 5,017,504 A | 5/1991 | Nishimura et al. ............ 437/40 |
| 5,021,355 A | 6/1991 | Dhong et al. .................. 437/35 |
| 5,042,011 A | 8/1991 | Casper et al. ................ 365/205 |
| 5,066,607 A | 11/1991 | Banerjee ...................... 437/52 |
| 5,078,798 A | 1/1992 | Nicolson et al. ................ 134/7 |
| 5,122,986 A | 6/1992 | Lim ...................... 365/189.11 |
| 5,220,530 A | 6/1993 | Itoh ....................... 365/189.01 |
| 5,280,205 A | 1/1994 | Green et al. ................. 307/530 |
| 5,291,438 A | 3/1994 | Witek et al. |
| 5,308,783 A | 5/1994 | Krautschneider et al. ..... 437/52 |
| 5,329,481 A | 7/1994 | Seevinck et al. |

(Continued)

FOREIGN PATENT DOCUMENTS

JP    61-140170    6/1986

(Continued)

OTHER PUBLICATIONS

Adler, E., et al., "The Evolution of IBM CMOS DRAM Technology", *IBM Journal of Research & Development*, 39(1-2), (Jan.-Mar. 1995), 167-188.

(Continued)

*Primary Examiner*—Chandra Chaudhari
(74) *Attorney, Agent, or Firm*—Schwegman, Lundberg, Woessner & Kluth, P.A.

(57) ABSTRACT

A high density vertical gain cell is realized for memory operation. The gain cell includes a vertical MOS transistor used as a sense transistor having a floating body between a drain region and a source region, and a second vertical MOS transistor merged with the sense transistor. Addressing the second vertical MOS transistor provides a means for changing a potential of the floating body of the sense transistor. The vertical gain cell can be used in a memory array with a read data/bit line and a read data word line coupled to the sense transistor, and with a write data/bit line and a write data word line coupled to the second transistor of the vertical gain cell.

33 Claims, 8 Drawing Sheets

U.S. PATENT DOCUMENTS

| | | | |
|---|---|---|---|
| 5,378,914 A | 1/1995 | Ohzu et al. ............... 257/369 |
| 5,381,302 A | 1/1995 | Sandhu et al. ............ 361/305 |
| 5,385,853 A | 1/1995 | Mohammad ............... 437/41 |
| 5,414,288 A | 5/1995 | Fitch et al. ............... 257/328 |
| 5,448,513 A | 9/1995 | Hu et al. ................... 365/150 |
| 5,478,772 A | 12/1995 | Fazan ......................... 437/60 |
| 5,506,166 A | 4/1996 | Sandhu et al. ............ 437/60 |
| 5,519,236 A | 5/1996 | Ozaki ........................ 257/302 |
| 5,574,299 A | 11/1996 | Kim ........................... 257/296 |
| 5,627,785 A | 5/1997 | Gilliam et al. ......... 365/189.01 |
| 5,707,885 A | 1/1998 | Lim ............................ 437/52 |
| 5,719,409 A | 2/1998 | Singh et al. ............... 257/77 |
| 5,732,014 A | 3/1998 | Forbes ....................... 365/149 |
| 5,793,686 A | 8/1998 | Furutani et al. |
| 5,854,500 A | 12/1998 | Krautschneider ........... 257/300 |
| 5,897,351 A | 4/1999 | Forbes ....................... 438/242 |
| 5,909,618 A | 6/1999 | Forbes et al. .............. 438/242 |
| 5,936,274 A | 8/1999 | Forbes et al. .............. 257/315 |
| 5,937,296 A | 8/1999 | Arnold ....................... 438/270 |
| 5,959,327 A | 9/1999 | Sandhu et al. ............. 257/310 |
| 5,966,319 A | 10/1999 | Sato |
| 5,973,356 A | 10/1999 | Noble et al. ............... 257/319 |
| 5,991,225 A | 11/1999 | Forbes et al. .......... 365/230.06 |
| 5,998,820 A | 12/1999 | Chi |
| 5,999,455 A | 12/1999 | Lin et al. ............... 365/185.24 |
| 6,030,847 A | 2/2000 | Fazan et al. ................. 438/3 |
| 6,031,263 A | 2/2000 | Forbes et al. .............. 257/315 |
| 6,072,209 A | 6/2000 | Noble et al. ............... 257/296 |
| 6,077,745 A | 6/2000 | Burns, Jr. et al. |
| 6,097,065 A | 8/2000 | Forbes et al. .............. 257/350 |
| 6,104,061 A | 8/2000 | Forbes et al. .............. 257/330 |
| 6,111,286 A | 8/2000 | Chi et al. |
| 6,124,729 A | 9/2000 | Noble et al. ................ 326/41 |
| 6,143,636 A | 11/2000 | Forbes et al. .............. 438/587 |
| 6,150,687 A | 11/2000 | Noble et al. ............... 257/302 |
| 6,153,468 A | 11/2000 | Forbes et al. .............. 438/257 |
| 6,172,390 B1 | 1/2001 | Rupp et al. ................. 257/302 |
| 6,191,448 B1 | 2/2001 | Forbes et al. .............. 257/330 |
| 6,204,115 B1 | 3/2001 | Cho |
| 6,238,976 B1 | 5/2001 | Noble et al. ............... 438/259 |
| 6,246,083 B1 | 6/2001 | Noble ......................... 257/296 |
| 6,249,020 B1 | 6/2001 | Forbes et al. .............. 257/315 |
| 6,249,460 B1 | 6/2001 | Forbes et al. .......... 365/185.28 |
| 6,282,115 B1 | 8/2001 | Furukawa et al. |
| 6,307,775 B1 | 10/2001 | Forbes et al. .......... 365/185.01 |
| 6,316,309 B1 | 11/2001 | Holmes et al. |
| 6,350,635 B1 | 2/2002 | Noble et al. ............... 438/156 |
| 6,384,448 B1 | 5/2002 | Forbes ....................... 257/315 |
| 6,399,979 B1 | 6/2002 | Noble et al. ............... 257/302 |
| 6,440,801 B1 | 8/2002 | Furukawa et al. |
| 6,456,535 B2 | 9/2002 | Forbes et al. .......... 365/185.28 |
| 6,492,233 B2 | 12/2002 | Forbes et al. .............. 438/270 |
| 6,501,116 B2 | 12/2002 | Kisu, deceased et al. ... 257/296 |
| 6,504,201 B1 | 1/2003 | Noble et al. ............... 257/302 |
| 6,531,730 B2 | 3/2003 | Sandhu et al. ............. 257/310 |
| 6,538,916 B2 | 3/2003 | Ohsawa ..................... 365/149 |
| 6,566,682 B2 | 5/2003 | Forbes |
| 6,624,033 B2 | 9/2003 | Noble ........................ 438/300 |
| 6,625,057 B2 | 9/2003 | Iwata |
| 6,661,042 B2 | 12/2003 | Hsu |
| 6,680,864 B2 | 1/2004 | Noble ........................ 365/177 |
| 6,686,624 B2 | 2/2004 | Hsu |
| 6,710,465 B2 | 3/2004 | Song et al. ................. 257/316 |
| 6,727,141 B1 | 4/2004 | Bronner et al. ............. 438/242 |
| 6,747,314 B2 | 6/2004 | Sundaresan et al. |
| 6,750,095 B1 | 6/2004 | Bertagnoll et al. |
| 6,781,197 B2 * | 8/2004 | Fujishima et al. .......... 257/329 |
| 6,838,723 B2 | 1/2005 | Forbes |
| 6,940,761 B2 | 9/2005 | Forbes |
| 6,943,083 B2 | 9/2005 | Forbes |
| 6,956,256 B2 | 10/2005 | Forbes |
| 6,975,531 B2 | 12/2005 | Forbes |
| 7,030,436 B2 | 4/2006 | Forbes |
| 7,149,109 B2 | 12/2006 | Forbes |
| 7,151,690 B2 | 12/2006 | Forbes |
| 2001/0028078 A1 | 10/2001 | Noble ........................ 257/303 |
| 2001/0030338 A1 | 10/2001 | Noble ........................ 257/303 |
| 2001/0032997 A1 | 10/2001 | Forbes et al. .............. 257/315 |
| 2001/0044188 A1 * | 11/2001 | Heo et al. ................... 438/270 |
| 2001/0053096 A1 | 12/2001 | Forbes et al. .......... 365/185.28 |
| 2002/0098639 A1 | 7/2002 | Kisu et al. .................. 438/238 |
| 2002/0126536 A1 | 9/2002 | Forbes et al. .......... 365/185.28 |
| 2003/0001191 A1 | 1/2003 | Forbes et al. .............. 257/306 |
| 2003/0129001 A1 | 7/2003 | Kisu et al. .................. 399/200 |
| 2003/0155604 A1 | 8/2003 | Sandhu et al. ............. 257/310 |
| 2003/0205754 A1 | 11/2003 | Forbes et al. .............. 257/314 |
| 2005/0012130 A1 | 1/2005 | Forbes |
| 2005/0024936 A1 | 2/2005 | Forbes |
| 2005/0041457 A1 | 2/2005 | Forbes |
| 2005/0068828 A1 | 3/2005 | Forbes |
| 2005/0094453 A1 | 5/2005 | Forbes |
| 2005/0265069 A1 | 12/2005 | Forbes |
| 2006/0028859 A1 | 2/2006 | Forbes |
| 2006/0226463 A1 | 10/2006 | Forbes |
| 2006/0231879 A1 | 10/2006 | Forbes |
| 2006/0252206 A1 | 11/2006 | Forbes |

FOREIGN PATENT DOCUMENTS

| | | |
|---|---|---|
| JP | 5226661 | 9/1993 |

OTHER PUBLICATIONS

Blalock, T. N., et al., "An Experimental 2T Cell RAM with 7 NS Access Time at Low Temperature", *1990 Symposium on VLSI Circuits, Digest of Technical Papers*, (1990), 13-14.

Kim, Wonchan, "A low-voltage multi-bit DRAM cell with a built-in gain stage", *ESSCIRC 93: Nineteenth European Solid-State Circuits Conference. Proceedings*, (1993),37-40.

Kim, W., "An Experimental High-Density DRAM Cell with a Built-in Gain Stage", *IEEE Journal of Solid-State Circuits*, 29(8), (Aug. 1994),978-981.

Krautschneider, W H., et al., "Fully scalable gain memory cell for future DRAMs", *Microelectronic Engineering*, 15(1-4), (Oct. 1991),367-70.

Krautschneider, F., "Planar Gain Cell for Low Voltage Operation and Gigabit Memories", *Symposium on VLSI Technology Digest of Technical papers*, (1995),139-140.

Mukai, M., et al., "A novel merged gain cell for logic compatible high density DRAMs", *1997 Symposium on VLSI Technology. Digest of Technical Papers*, (Jun. 10-12, 1997),155-156.

Mukai, M , et al., "Proposal of a Logic Compatible Merged-Type Gain Cell for High Density Embedded . . . ", *IEEE Transactions on Electron Devices*, (Jun. 1999), 1201-1206.

Ohsawa, T , "Memory design using one-transistor gain cell on SOI", *IEEE International Solid-State Circuits Conference. Digest of Technical Papers*, vol. 1, (2002), 152-455.

Okhonin, S , "A SOI capacitor-less 1T-DRAM concept", 2001 IEEE International SOI Conference. Proceedings, *IEEE. 2001*, (2000), 153-4.

Rabaey, Jan M., "Digital integrated circuits : a design perspective", Upper Saddle River, N.J. : Prentice Hall, (1996),585-590.

Rabaey, Jan E., "Digital integrated circuits : a design perspective", *Prentice Hall electronics and VLSI series*, Upper Saddle River, N.J. : Prentice Hall, c1996,(1996),585-587.

Shukuri, S , "A complementary gain cell technology for sub-1 V supply DRAMs", Electron Devices Meeting 1992. *Technical Digest*, (1992), 1006-1009.

Shukuri, S. , "A Semi-Static Complementary Gain Cell Technology for Sub-1 V Supply DRAMs", *IEEE Transactions on Electron Devices*, 41(6), (Jun. 1994),926-931.

Shukuri, S. , "Super-Low Voltage Operation of a Semi-Static Complementary Gain DRAM Memory Cell", Symposium on VLSI Technology. *Digest of Technical Papers*, (1993),23-24.

Sunouchi, K., et al., "A self-amplifying (SEA) cell for future high density DRAMs", International Electron Devices Meeting 1991. *Technical Digest*, (1991),465-8.

Takato, H., et al., "Process Integration Trends for Embedded DRAM", *ULSI Process Integration. Proceedings of the First International Symposium*(Electrochemical Society Proceedings vol. 99-18, (1999), 107-19.

Terauchi, M., "A Surrounding Gate Transistor (SGT) Gain Cell for Ultra High Density DRAMs", 1993 Symposium on VLSI Technology. *Digest of Technical Papers*, Kyoto, Japan,(1993),21-22.

Wann, Hsing-Jen, "A Capacitorless DRAM Cell on SOI Substrate", International Electron Devices Meeting 1993. *Technical Digest*, (Dec. 5-8, 1993),635-638.

Wann, Hsing-Jen, et al., "A capacitorless DRAM cell on SOI substrate", Electron Devices Meeting, 1993. *Technical Digest*, (Dec. 1993), 1 page.

* cited by examiner

_US 7,241,658 B2_

VERTICAL GAIN CELL

RELATED APPLICATIONS

This application is a divisional under 37 CFR 1.53(b) of U.S. application Ser. No. 10/379,478 filed Mar. 4, 2003 now U.S. Pat. No. 6,956,256, which application is incorporated herein by reference.

This application is related to the following, co-pending, commonly assigned applications, incorporated herein by reference:

U.S. application Ser. No. 10/231,397, entitled: "Single Transistor Vertical Memory Gain Cell,"

U.S. application Ser. No. 10/230,929, entitled: "Merged MOS-Bipolar Capacitor Memory Cell,"

U.S. application Ser. No. 10/309,873, filed Dec. 4, 2002, entitled: "Embedded DRAM Gain Memory Cell," and U.S. application Ser. No. 10/292,080, filed Nov. 12, 2002, entitled: "$6F^2$ 3-Transistor Dram Gain Cell."

TECHNICAL FIELD

The present subject matter relates generally to integrated circuits, and in particular to gain cells for memory operation.

BACKGROUND

An important semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 100. Each cell 100 contains a storage capacitor 140 and an access field effect transistor or transfer device 120. For each cell, one side of storage capacitor 140 is connected to a reference voltage (illustrated as a ground potential for convenience purposes). The other side of storage capacitor 140 is connected to the drain of transfer device 120. The gate of transfer device 120 is connected to a word line 180. The source of transfer device 120 is connected to a bit line 160 (also known in the art as a digit line). With the components of memory cell 100 connected in this manner, it is apparent that word line 180 controls access to storage capacitor 140 by allowing or preventing a signal (representing a logic "0" or a logic "1") carried on bit line 160 to be written to or read from storage capacitor 140. Thus, each cell 100 contains one bit of data (i.e., a logic "0" or logic "1").

FIG. 2 illustrates, in a block diagram, an architecture for a DRAM circuit 240. DRAM 240 contains a memory array 242, row and column decoders 244, 248 and a sense amplifier circuit 246. Memory array 242 consists of a plurality of memory cells 200 (constructed as illustrated in FIG. 1) whose word lines 280 and bit lines 260 are commonly arranged into rows and columns, respectively. Bit lines 260 of memory array 242 are connected to sense amplifier circuit 246, while its word lines 280 are connected to row decoder 244. Address and control signals are input into DRAM 240 on address/control lines 261. Address/control lines 261 are connected to column decoder 248, sense amplifier circuit 246, and row decoder 244, and are used to gain read and write access, among other things, to memory array 242.

Column decoder 248 is connected to sense amplifier circuit 246 via control and column select signals on column select lines 262. Sense amplifier circuit 246 receives input data destined for memory array 242 and outputs data read from memory array 242 over input/output (I/O) data lines 263. Data is read from the cells of memory array 242 by activating a word line 280 (via row decoder 244), which couples all of the memory cells corresponding to that word line to respective bit lines 260, which define the columns of the array. One or more bit lines 260 are also activated. When a particular word line 280 and bit lines 260 are activated, sense amplifier circuit 246 connected to a bit line column detects and amplifies the data bit transferred from the storage capacitor of the memory cell to its bit line 260 by measuring the potential difference between the activated bit line 260 and a reference line which may be an inactive bit line. The operation of DRAM sense amplifiers is described, for example, in U.S. Pat. Nos. 5,627,785; 5,280,205; and 5,042,011, all assigned to Micron Technology Inc., and incorporated by reference herein.

The memory cells of dynamic random access memories (DRAMs) include a field-effect transistor (FET) and a capacitor which functions as a storage element. The need to increase the storage capability of semiconductor memory devices has led to the development of very large scale integrated (VLSI) cells which provides a substantial increase in component density. As component density has increased, cell capacitance has had to be decreased because of the need to maintain isolation between adjacent devices in the memory array. However, reduction in memory cell capacitance reduces the electrical signal output from the memory cells, making detection of the memory cell output signal more difficult. Thus, as the density of DRAM devices increases, it becomes more and more difficult to obtain reasonable storage capacity.

As DRAM devices are projected as operating in the gigabit range, the ability to form such a large number of storage capacitors requires smaller areas. However, this conflicts with the requirement for larger capacitance because capacitance is proportional to area. Moreover, the trend for reduction in power supply voltages results in stored charge reduction and leads to degradation of immunity to alpha particle induced soft errors, both of which lead to larger storage capacitance.

In order to meet the high density requirements of VLSI cells in DRAM cells, some manufacturers are utilizing DRAM memory cell designs based on non-planar capacitor structures, such as complicated stacked capacitor structures and deep trench capacitor structures. Although non-planar capacitor structures provide increased cell capacitance, such arrangements create other problems that effect performance of the memory cell. For example, with trench capacitors formed in a semiconductor substrate, the problem of trench-to-trench charge leakage caused by the parasitic transistor effect between adjacent trenches is enhanced. Moreover, the alpha-particle component of normal background radiation can generate hole-electron pairs in the silicon substrate which functions as one of the storage plates of the trench capacitor. This phenomena will cause a charge stored within the affected cell capacitor to rapidly dissipate, resulting in a soft error.

Another approach has been to provide DRAM cells having a dynamic gain. These memory cells are commonly referred to as gain cells. For example, U.S. Pat. No. 5,220, 530 discloses a two-transistor gain-type dynamic random access memory cell. The memory cell includes two field-effect transistors, one of the transistors functioning as write transistor and the other transistor functioning as a data storage transistor. The storage transistor is capacitively coupled via an insulating layer to the word line to receive substrate biasing by capacitive coupling from the read word line. This gain cell arrangement requires a word line, a bit or data line, and a separate power supply line, which is a disadvantage, particularly in high density memory structures.

Recently a one transistor gain cell has been reported as shown in FIG. 3. (See generally, T. Ohsawa et al., "Memory design using one transistor gain cell on SOI," IEEE Int. Solid State Circuits Conference, San Francisco, 2002, pp. 152–153). FIG. 3 illustrates a portion of a DRAM memory circuit containing two neighboring gain cells 301, 303. Each gain cell 301, 303 is separated from a substrate 305 by a buried oxide layer 307. Gain cells 301, 303 are formed on buried oxide 307 and have a floating body 309-1, 309-2, respectively, separating a source region 311 (shared for the two cells) and a drain region 313-1, 313-2, respectively. A bit/data line 315 is coupled to drain regions 313-1, 313-2 via bit contacts 317-1, 317-2, respectively. A ground source 319 is coupled to source region 311. Additionally, word lines or gates 321-1, 321-2 oppose the floating body regions 309-1, 309-2, respectively, and each is separated therefrom by a gate oxide 323-1, 323-2, respectively.

In the gain cell shown in FIG. 3, a back gate bias for each floating body 309-1, 309-2 is used to modulate the threshold voltage and consequently the conductivity of the NMOS transistor in each gain cell. The potential of floating body 309-1, 309-2 is made more positive by avalanche breakdown in drain regions, 313-1, 313-2, and collection of holes generated by floating body 309-1, 309-2. A more positive potential or forward bias applied to floating body 309-1, 309-2 decreases the threshold voltage and makes the transistor more conductive when addressed. Charge storage is accomplished by this additional charge stored on floating body 309-1, 309-2. Reset is accomplished by forward biasing the drain-body n-p junction diode to remove charge from floating body 309-1, 309-2.

However, avalanche breakdown is likely to result in damage to the semiconductor over a large number of cycles as required by DRAM operation, and high electric fields in the device will cause charge injection into the gate oxides or insulators. These factors can result in permanent damage and degradation of the memory cell.

There is a need for a memory cell structure adapted for high density design that provides a capability for higher reliability and longer operating life.

SUMMARY

In an embodiment, a high density vertical gain cell is realized for memory operation. The gain cell includes a vertical MOS transistor used as a sense transistor having a floating body between a drain region and a source region, and a second vertical MOS transistor merged with the sense transistor. Addressing the second vertical MOS transistor provides a means for changing a potential of the floating body of the sense transistor. The vertical gain cell can be used in a memory array with a read data/bit line and a read data word line coupled to the sense transistor, and with a write data/bit line and a write data word line coupled to the second transistor of the vertical gain cell.

These and other embodiments, aspects, advantages, and features are set forth in part in the description that follows, and will be apparent to those skilled in the art by reference to the following description and referenced drawings.

DETAILED DESCRIPTION

Figure 1:
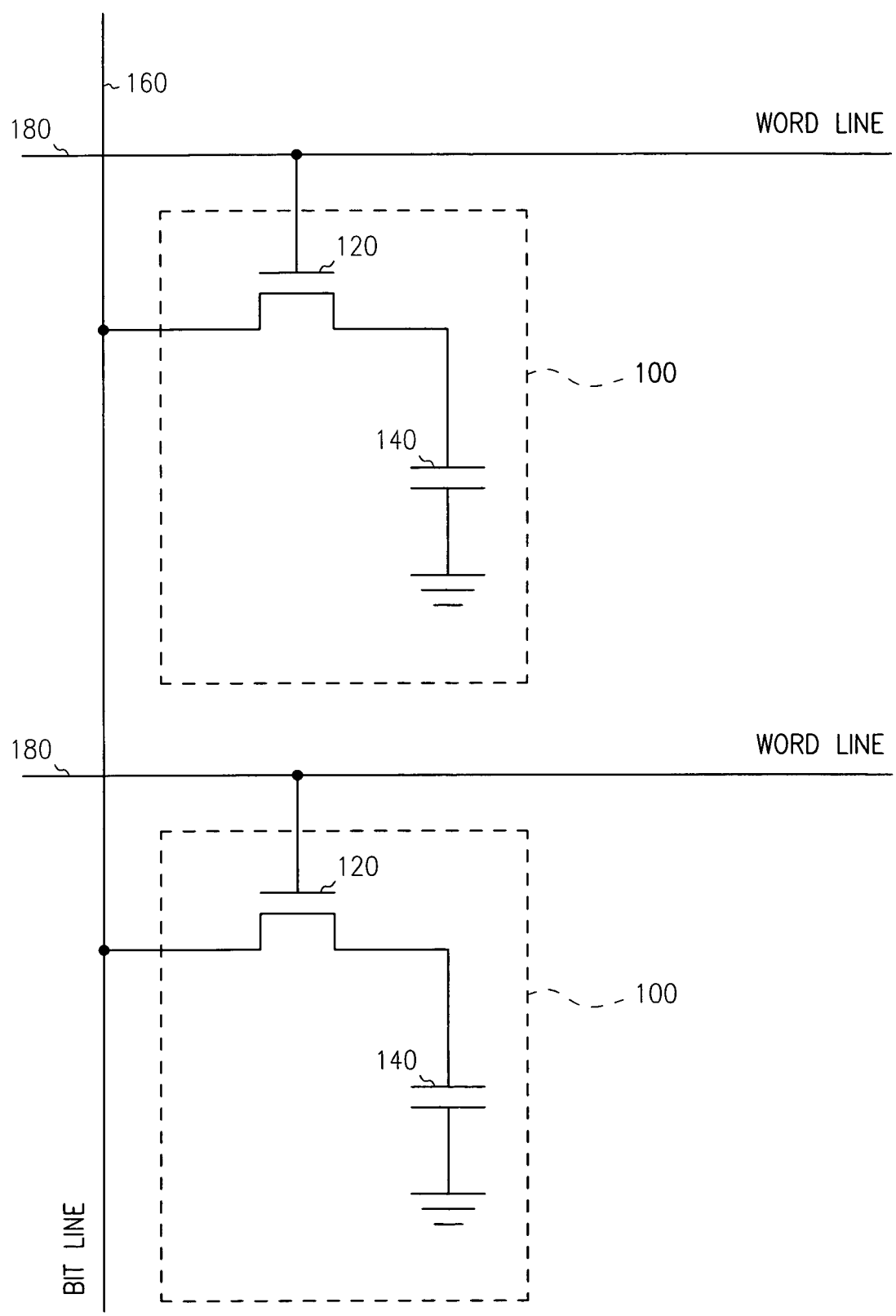
FIG. 1 is a circuit diagram illustrating conventional dynamic random access memory (DRAM) cells.
Figure 2:
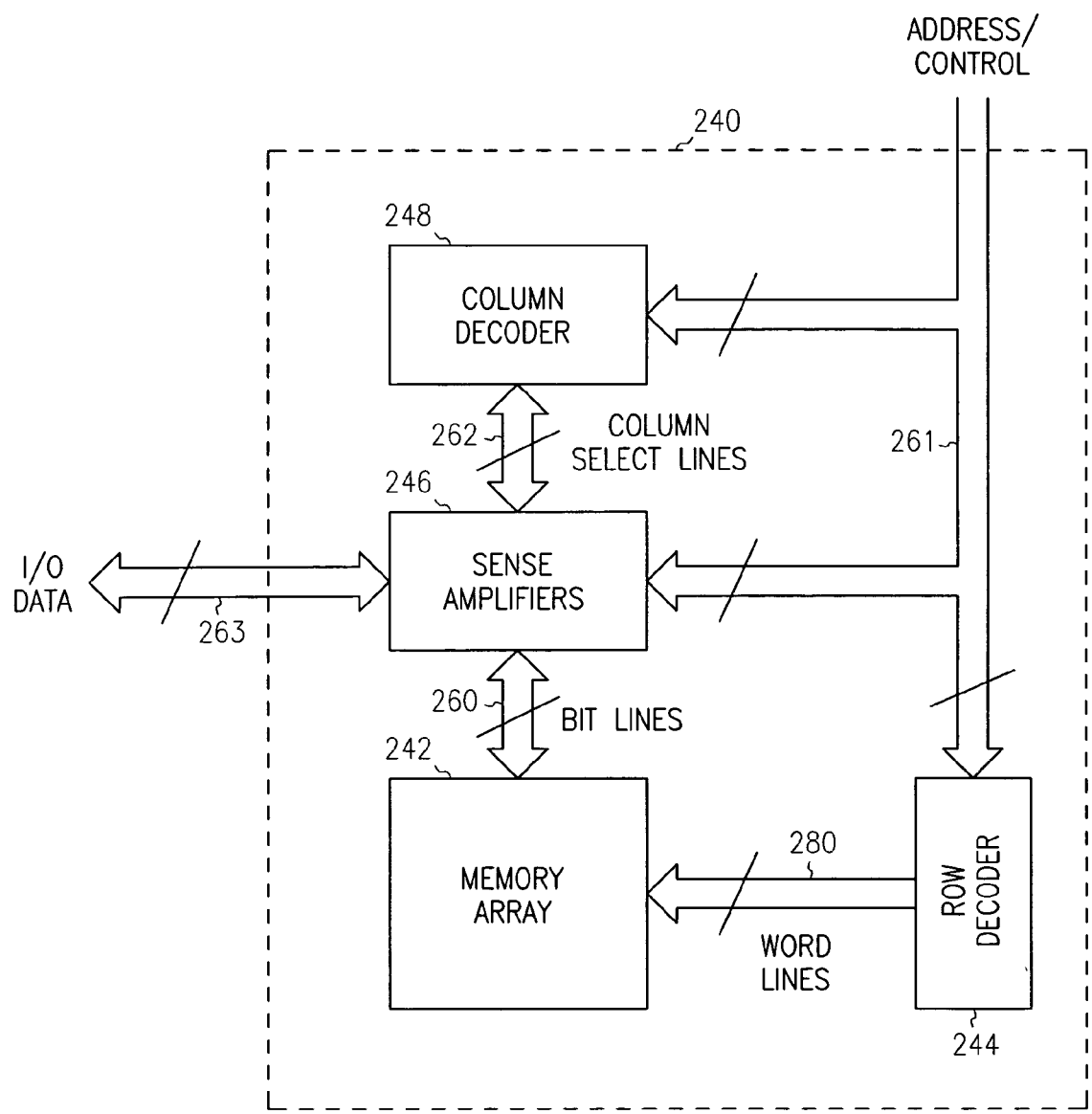
FIG. 2 is a block diagram illustrating a DRAM device.
Figure 3:
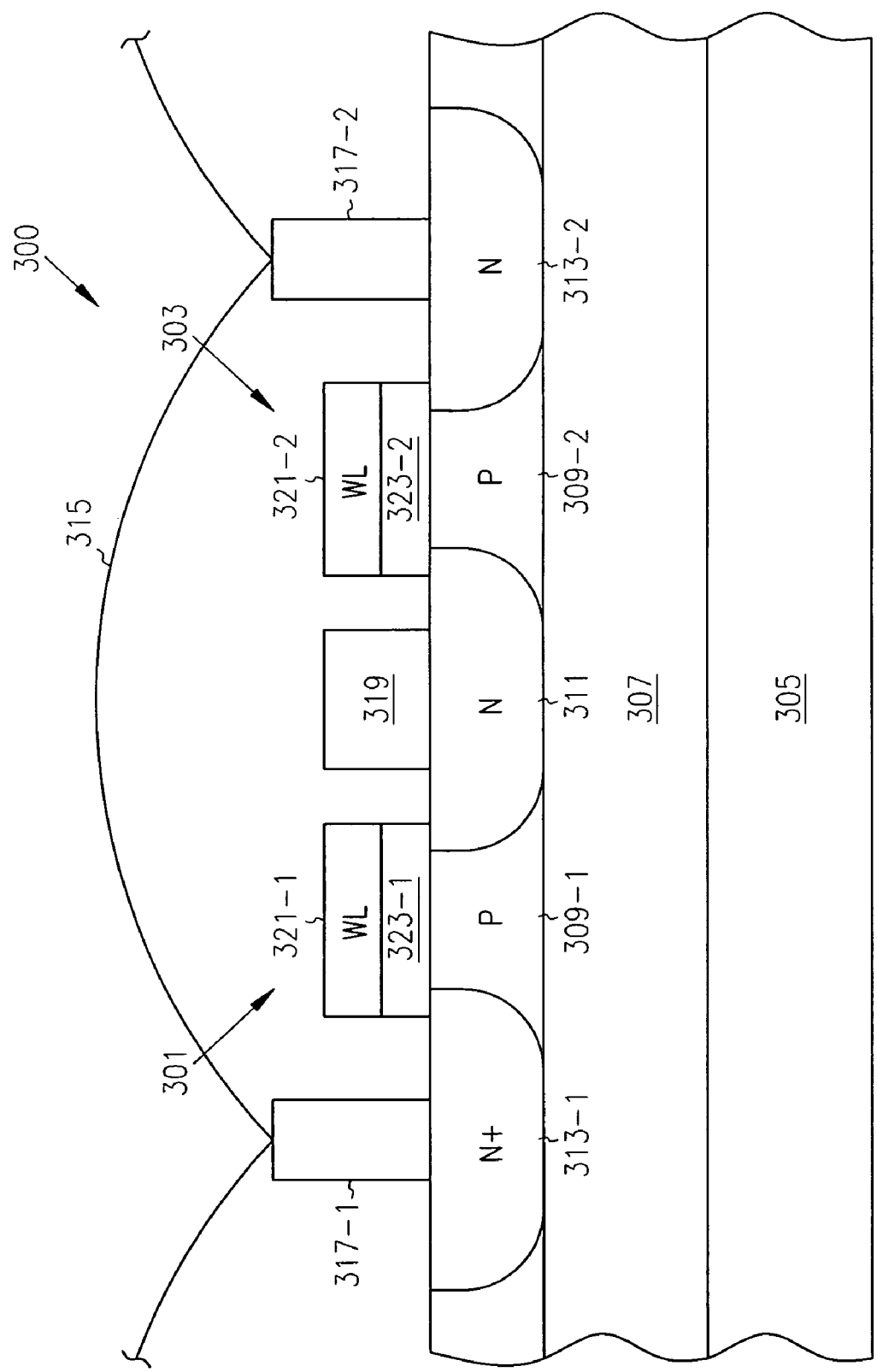
FIG. 3 illustrates a portion of a DRAM memory circuit containing two neighboring gain cells.

The following detailed description refers to the accompanying drawings that show, by way of illustration, specific aspects and embodiments in which the present subject matter may be practiced. These embodiments are described in sufficient detail to enable those skilled in the art to practice the present subject matter. Other embodiments may be utilized and structural, logical, and electrical changes may be made without departing from the scope of the present subject matter. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors. Additionally, a heavily doped p-type region can be referred to as a p+-type region or a p+ region, and a heavily doped n-type region can be referred to as an n+-type region or an n+ region.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present subject matter is defined only by the appended claims, along with the full scope of equivalents to which such claims are entitled.

An embodiment of an electronic apparatus having a vertical gain cell includes a vertical MOS transistor configured as a sense transistor with a floating body, and a second vertical MOS transistor merged with the vertical MOS sense transistor. The sense transistor and the second vertical transistor merged with the sense transistor are configured as a vertical gain cell. In such a configuration, addressing the second vertical MOS transistor changes a potential of the floating body of the sense transistor. In an embodiment, the floating body of the vertical sense transistor provides a drain region for the second vertical MOS transistor. In an embodiment, the source of the vertical sense transistor and the body of the second vertical MOS transistor may be formed in a common region, which allows for the source of the vertical sense transistor and the body of the second vertical MOS transistor to be coupled to a common node, such as a ground.

In an embodiment, an electronic apparatus is a memory device, which may include a DRAM. In a memory device embodiment, the vertical gain cell can be used in a memory array with a read data/bit line and a read data word line coupled to the sense transistor, and with a write data/bit line and a write data word line coupled to the second transistor of the vertical gain cell. In a further embodiment, the vertical gain cell provides for a high density of memory cells, where each memory cell is a vertical gain cell having an area of approximately $4F^2$, where F is a minimum feature size.

Figure 4A:
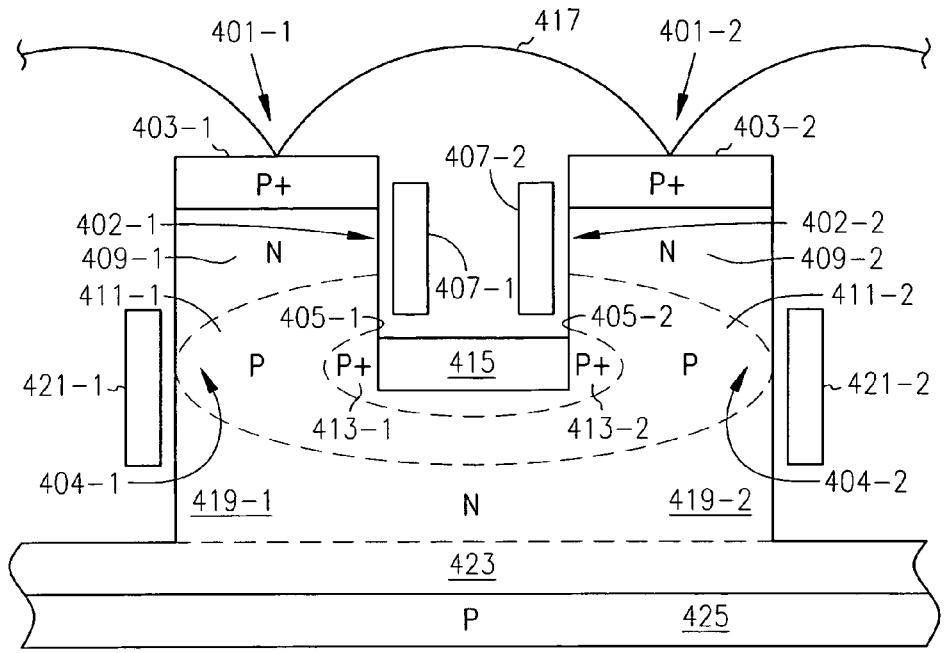
FIG. 4A is a cross-sectional view illustrating an embodiment of two vertical DRAM gain cells, each having two vertical MOS transistors merged

FIG. 4A is a cross-sectional view illustrating an embodiment of two vertical DRAM gain cells, 401-1 and 401-2, each having two merged vertical MOS transistors. The illustrated embodiment uses a vertical MOS transistor in each vertical gain cell to fix a body potential of another vertical MOS transistor in the same gain cell for sensing a state of the vertical gain cell. This structure or architecture avoids problems associated with memory cells that rely on avalanche breakdown.

In an embodiment as shown in FIG. 4A, vertical gain cell 401-1 may include a vertical sense transistor 402-1 and a second vertical transistor 404-1 merged with sense transistor 402-1. In this embodiment, vertical sense transistor 402-1 and merged second transistor 404-1 are MOS transistors. Sense transistor 402-1 includes a drain region 403-1, a source region 405-1, and a gate 407-1, where a floating body 409-1 separates drain region 403-1 from source region 405-1. In this embodiment, sense transistor 402-1 is a p-channel MOS (PMOS) transistor. Its source region 405-1 includes a p-type region 411-1 joining a heavily doped p-type region 413-1 coupled to a conductive source line 415. In an embodiment, source line 415 is a heavily doped p-type polysilicon.

Gate 407-1 opposes floating body 409-1 and is separated from floating body 409-1 by a gate oxide. Gate 407-1 couples to or is formed as an integral part of a read data word line. Gate 407-1 and read data word line are conductive material. In an embodiment, gate 407-1 and/or read data word line are polysilicon. Further, as can be understood by those skilled in the art, a suitable dielectric material may replace a gate oxide.

Drain region 403-1 is coupled to a read data/bit line 417. Read data/bit line 417 is a conductive material, which may include metallic materials. In the embodiment of FIG. 4A, drain region 403-1 is a heavily doped p-type region. Further, in this configuration, read data/bit line 417 and read data word line 407-1 both couple to sense transistor 402-1.

In the embodiment of FIG. 4A, second vertical MOS transistor 404-1 is an n-channel MOS (NMOS) transistor that includes a drain region 409-1, a source region 419-1, and a gate 421-1. Drain region 409-1 is merged with floating body 409-1 of sense transistor 402-1. This merged configuration of drain region 409-1 of second vertical transistor 404-1 with floating body 409-1 of vertical sense transistor 402-1 allows a potential of floating body 409-1 to be changed by addressing second vertical MOS transistor 404-1.

Source region 419-1 is separated from drain region 409-1 by a body 411-1, which is separated from gate 421-1 by an oxide. Body 411-1 merges into source region 411-1 of sense transistor 402-1. Further, this merged configuration for body 411-1 of second vertical transistor 404-1 allows for source 405-1 of vertical sense transistor 402-1 and body 411-1 of second vertical MOS transistor 404-1 to be coupled to a common node, such as a ground, via source line 415. Further, source region 419-1 is disposed on a write data/bit line 423 that is disposed on a p-type substrate 425. Write data/bit line 423 includes conductive material. In an embodiment, write data/bit line 423 is heavily doped n-type material. In a further embodiment, write data/bit line 423 is heavily doped n-type silicon.

Gate 421-1 opposes body 411-1 and is separated from floating body 411-1 by a gate oxide. Gate 421-1 couples to or is formed as an integral part of a write data word line. Gate 421-1 and write data word line are conductive material. In an embodiment, gate 421-1 and/or write data word line are polysilicon. Further, as can be understood by those skilled in the art, a suitable dielectric material may replace a gate oxide. In this configuration, write data/bit line 423 and write data word line 421-1 both couple to second vertical transistor 404-1.

Vertical gain cell 401-2 is configured in the same manner as vertical gain cell 401-1. In an embodiment as shown in FIG. 4A, vertical gain cell 401-2 may include a vertical sense transistor 402-2 and a second vertical transistor 404-2 merged with sense transistor 402-2. In this embodiment, vertical sense transistor 402-2 and merged second transistor 404-2 are MOS transistors. Sense transistor 402-2 includes a drain region 403-2, a source region 405-2, and a gate 407-2, where a floating body 409-2 separates drain region 403-2 from source region 405-2. In this embodiment, sense transistor 402-2 is a p-channel MOS (PMOS) transistor. Its source region 405-2 includes a p-type region 411-2 joining a heavily doped p-type region 413-2 coupled to a conductive source line 415. In an embodiment, source line 415 is a heavily doped p-type polysilicon.

Gate 407-2 opposes floating body 409-2 and is separated from floating body 409-2 by a gate oxide. Gate 407-2 couples to or is formed as an integral part of a read data word line. Gate 407-2 and read data word line are conductive material. In an embodiment, gate 407-2 and/or read data word line are polysilicon. Further, as can be understood by those skilled in the art, a suitable dielectric material may replace a gate oxide.

Drain region 403-2 is coupled to a read data/bit line 417. Read data/bit line 417 is a conductive material, which may include conventional metallic materials. In the embodiment of FIG. 4A, drain region 403-2 is a heavily doped p-type region. Further, in this configuration, read data/bit line 417 and read data word line 407-2 both couple to sense transistor 402-2.

In the embodiment of FIG. 4A, second vertical MOS transistor 404-2 is an n-channel MOS (NMOS) transistor that includes a drain region 409-2, a source region 419-2, and a gate 421-2. Drain region 409-2 is merged with floating body 409-2 of sense PMOS transistor 402-2. This merged configuration of drain region 409-2 of second vertical transistor 404-2 with floating body 409-2 of vertical sense transistor 402-2 allows a potential of floating body 409-2 to be changed by addressing second vertical MOS transistor 404-2.

Source region 419-2 is separated from drain region 409-2 by a body 411-2, which is separated from gate 421-2 by an oxide. Body 411-2 merges into source region 411-2 of sense transistor 402-2. Further, this merged configuration for body 411-2 of second vertical transistor 404-2 allows for source 405-2 of vertical sense transistor 402-2 and body 411-2 of second vertical MOS transistor 404-2 to be coupled to a common node, such as a ground, via source line 415. Further, source region 419-2 is disposed on write data/bit line 423 that is disposed on p-type substrate 425.

Gate 421-2 opposes body 411-2 and is separated from floating body 411-2 by a gate oxide. Gate 421-2 couples to or is formed as an integral part of a write data word line. Gate 421-2 and write data word line are conductive material. In an embodiment, gate 421-2 and/or write data word line are polysilicon. Further, as can be understood by those skilled in the art, a suitable dielectric material may replace a gate oxide. In this configuration, write data/bit line 423 and write data word line 421-2 both couple to second vertical transistor 404-2.

In the embodiment of FIG. 4A, source 419-1 of vertical gain cell 401-1 and source 419-2 of vertical gain cell 401-2 are part of a common n-type region. Alternately, vertical gain cells 401-1, 401-2 can be configured such that sources 419-1, 419-2 do not share a common n-type region.

Along a column of an array, each vertical gain cell 401-1, 401-2 is configured on write data/bit line 423. Further, each vertical gain cell 401-1, 401-2 is coupled to read data/bit line 417. However, each vertical gain cell 401-1, 401-2 disposed on write data/bit line 423 is addressed with a separate write data word line and a separate read data word line, which correspond to different rows of the array.

Figure 4B:
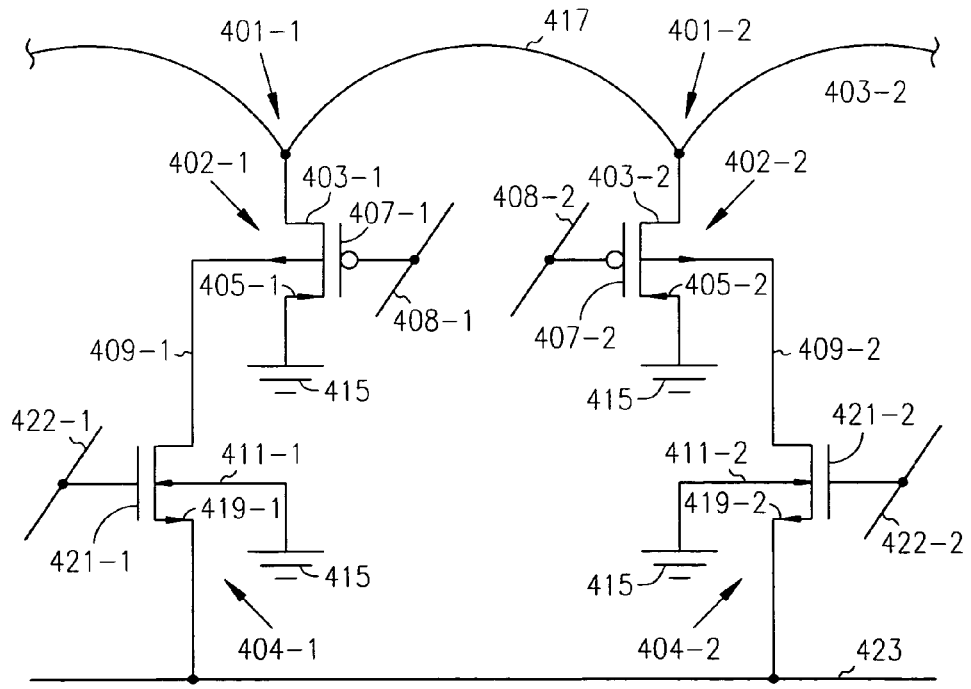
FIG. 4B illustrates an electrical equivalent circuit of an embodiment of two DRAM cells shown in FIG. 4A.

FIG. 4B illustrates an electrical equivalent circuit of an embodiment of DRAM cells 401-1, 401-2 shown in FIG. 4A. In FIG. 4B, vertical gain cells 401-1, 401-2 are both coupled to read data/bit line 417 and to write data/bit line 423. Further, each vertical gain cell includes two MOS transistors with PMOS sense transistor 402-1 (402-2) having floating body 409-1 (409-2) coupled to drain 409-1 (409-2) of NMOS second transistor 404-1 (404-2). Drain 403-1 (403-2) of PMOS sense transistor 402-1 (402-2) is coupled to read data/bit line 417, and source 419-1 (419-2) of NMOS second transistor 404-1 (404-2) is coupled to write data/bit line 423.

In vertical gain cell 401-1 (401-2), PMOS sense transistor 402-1 (402-2) has a gate 407-1 (407-2) coupled to read data word line 408-1 (408-2), and NMOS second transistor 404-1 (404-2) has a gate 421-1 (421-2) coupled to write data word line 422-1 (422-2). Further, source 405-1 (405-2) of PMOS sense transistor 402-1 (402-2) and body 411-1 (411-2) of NMOS second transistor 404-1 (404-2) couple to ground via source line 415.

Figure 4C:
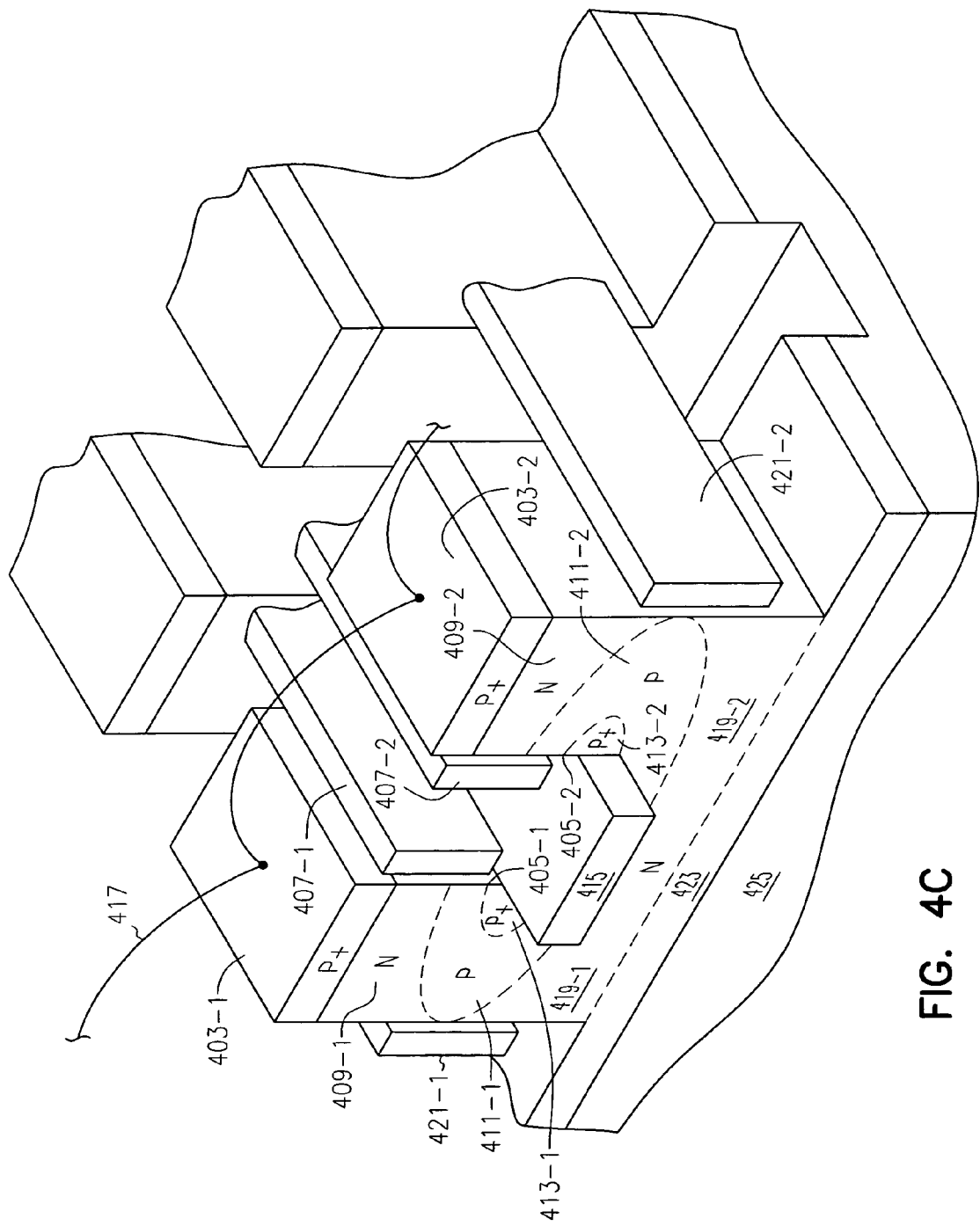
FIG. 4C illustrates a three dimensional view of an embodiment of two DRAM cells as shown in FIG. 4A.

In operation, transistor gain cell 401-1 effectively stores data in floating body 409-1 of sense transistor 402-1. The potential of floating body 409-1 can be changed by addressing the merged second transistor 404-1. In the embodiment of FIGS. 4A–4C, the device being addressed to read vertical gain cell 401-1 is PMOS transistor 402-1. The second merged NMOS transistor 404-1 fixes the potential of floating body 409-1 when write data word line 422-1 provides or "addresses" an input or signal to gate 421-1 turning on NMOS transistor 404-1 to operatively couple the merged drain 409-1 to the write data/bit line 423. Driving write data word line 422-1 positive writes a reverse bias on to floating body 409-1 of PMOS sense transistor 402-1. Thus, data is written using a specific and well-defined body potential that can be written into the cell from the write data/bit line 423. Operating in this manner avoids using avalanche multiplication to write data that is used by other memory structures.

If the write data word line 422-1 is at ground potential then the potential of floating body 409-1 of PMOS sense transistor 402-1 can be fixed to ground potential. In this manner the conductivity of the PMOS sense transistor 402-1 can be modulated and the different conductivity states sensed by the read data/bit line 417 when the cell is addressed by the read data word line 408-1 becoming negative and turning on the PMOS sense transistor 402-1.

Vertical gain cell 401-2 and other gain cells in the array operate in the same manner as vertical gain cell 401-1.

The vertical gain cell can provide a very high gain and amplification of the stored charge on the floating body of the PMOS sense transistor. A small change in the threshold voltage caused by charge stored on the floating body will result in a large difference in the number of holes conducted between the drain and source of the PMOS sense transistor during the read data operation. This amplification allows the small storage capacitance of the sense amplifier floating body to be used instead of a large stacked capacitor storage capacitance. The resulting vertical gain cell has a very high density with a cell area of $4F^2$, where F is a minimum feature size, and whose vertical extent is far less than the total height of a stacked capacitor or trench capacitor cell and access transistor.

FIG. 4C illustrates a three dimensional view of an embodiment of DRAM cells 401-1, 401-2 as shown in FIG. 4A. FIG. 4C illustrates the use of these vertical gain cells in an array of memory cells. Vertical gain cells disposed on a common write data/bit line 423, with each of these vertical gain cells coupled to a common read data/bit line 417, form a column in the memory array, where the number of columns correspond to the number of separate write data/bit lines. Vertical gain cells disposed on different write data/bit lines are configured on a common row when each of these vertical gain cells have a gate 407-1 coupled to or integrally formed with a common read data word line and a gate 421-1 coupled to or integrally formed with a common write data word line.

In the embodiment of FIG. 4C, gate 421-1 is formed as part of a write data word line, and gate 407-1 is formed as a part of a read data word line. In an embodiment, the write data word line having gate 421-1, the read data word line having gate 407-1, along with source line 415 are polysilicon. In an embodiment, source line 415 is heavily p-doped polysilicon.

An embodiment provides for an electronic apparatus having a vertical gain cell used in an application that senses a state of stored charge. The embodiment for the vertical gain cell includes a first vertical MOS transistor of one type conductivity configured as a sense transistor with a floating body and a second vertical MOS transistor of a second type conductivity merged with the first vertical MOS transistor. The electronic apparatus includes a means for controlling the second vertical MOS transistor to change a potential of the floating body of the sense transistor. In one embodiment, the second vertical MOS transistor is coupled to a conductive line, and the means for controlling the second vertical MOS transistor operatively turns on the second vertical MOS transistor to couple the floating body of the sense transistor to the conductive line. In an embodiment, the means for controlling the second vertical MOS transistor includes control circuitry coupled to the gate of the second vertical MOS transistor.

Figure 5:
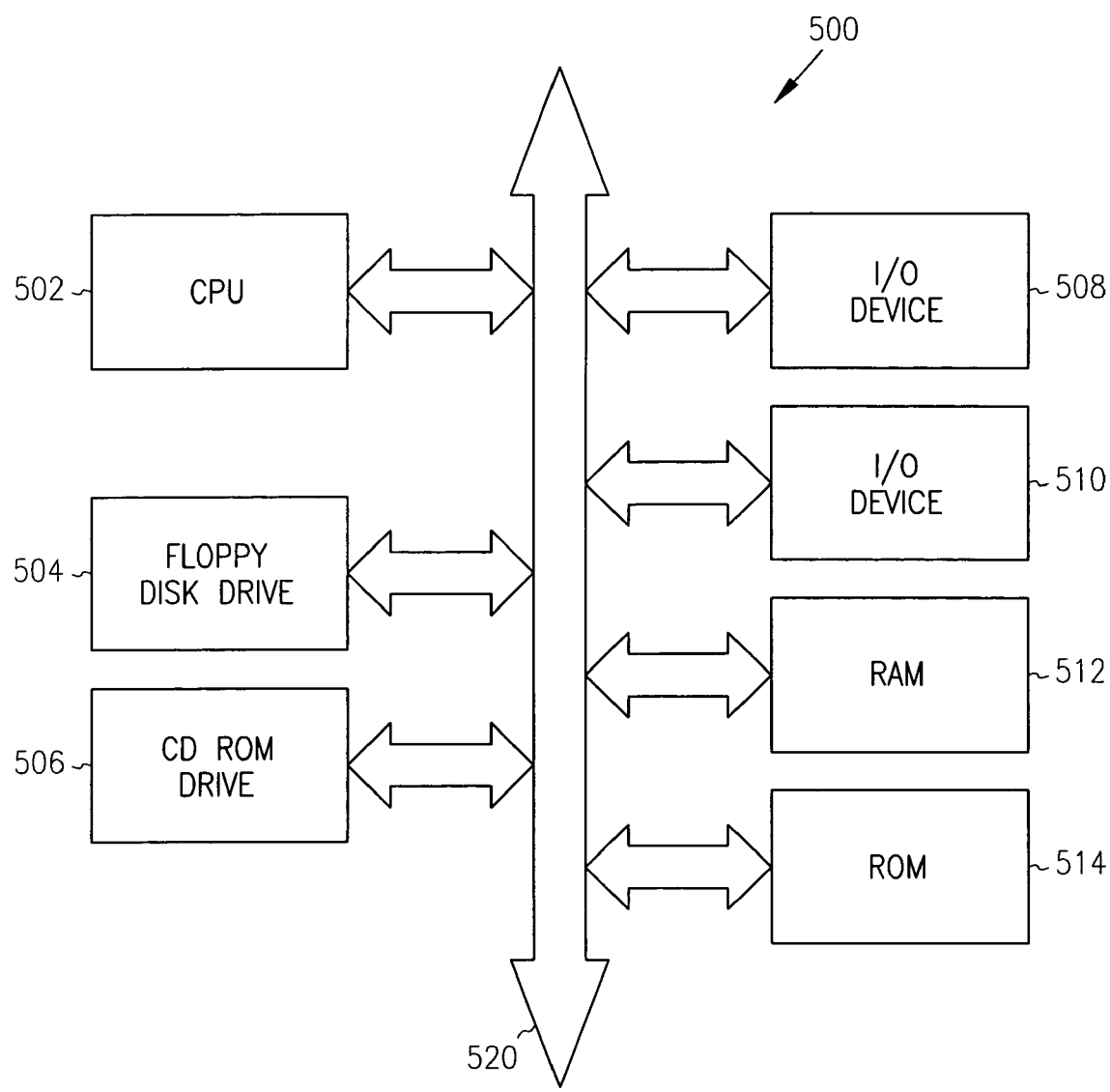
FIG. 5 is a block diagram illustrating an embodiment of an electronic system utilizing vertical gain cells.

FIG. 5 is a block diagram of an electronic apparatus configured as a processor-based system 500 utilizing vertical gain cells according to the various embodiments. Processor-based system 500 may be a computer system, a process control system or any other apparatus employing a processor and associated memory. System 500 includes a central processing unit (CPU) 502, e.g., a microprocessor, which communicates with RAM 512 and an I/O device 508 over a bus 520. Bus 520 may be a series of buses and bridges commonly used in a processor-based system, but for convenience, bus 520 has been illustrated as a single bus. A second I/O device 510 is illustrated, but is not necessary to practice every embodiment. Processor-based system 500 also includes read-only memory (ROM) 514 and may include peripheral devices such as a floppy disk drive 504 and a compact disk (CD) ROM drive 506 that also communicates with CPU 502 over bus 520 as is well known in the art.

It will be appreciated by those skilled in the art that additional circuitry and control signals can be provided, and that system 500 has been simplified to help focus on the various embodiments.

It will be understood that the embodiment shown in FIG. 5 illustrates an embodiment for an electronic apparatus in which the vertical gain cells are used. The illustration of system 500, as shown in FIG. 5, is intended to provide a general understanding of an application for electronic apparatus having a vertical gain cell, and is not intended to serve as a complete description of all the elements and features of an electronic apparatus using the vertical gain cell structures. Further, various embodiments are applicable to any size and type of system 500 using the vertical gain cells and is not intended to be limited to that described above. As one of ordinary skill in the art will understand, such an electronic apparatus can be fabricated in single-package processing units, or on a single semiconductor chip, in order to reduce the communication time between the processor and the memory device.

Applications containing the vertical gain cell as described in this disclosure include electronic apparatus for use in memory modules, device drivers, power modules, communication modems, processor modules, and application-specific modules, and may include multilayer, multichip modules. Such electronic apparatus can further be a subcomponent of a variety of electronic systems, such as a clock, a television, a cell phone, a personal computer, an automobile, an industrial control system, an aircraft, and others.

Methods of Fabrication

The inventor has previously disclosed a variety of vertical devices and applications employing transistors along the sides of rows or fins etched into bulk silicon or silicon on insulator wafers for devices in array type applications in memories. (See generally, U.S. Pat. Nos. 6,072,209; 6,150, 687; 5,936,274 and 6,143,636; 5,973,356 and 6,238,976; 5,991,225 and 6,153,468; 6,124,729; 6,097,065). An embodiment uses similar techniques to fabricate the single transistor vertical memory gain cell described herein. Each of the above reference US Patents is incorporated in full herein by reference.

Figure 6A:
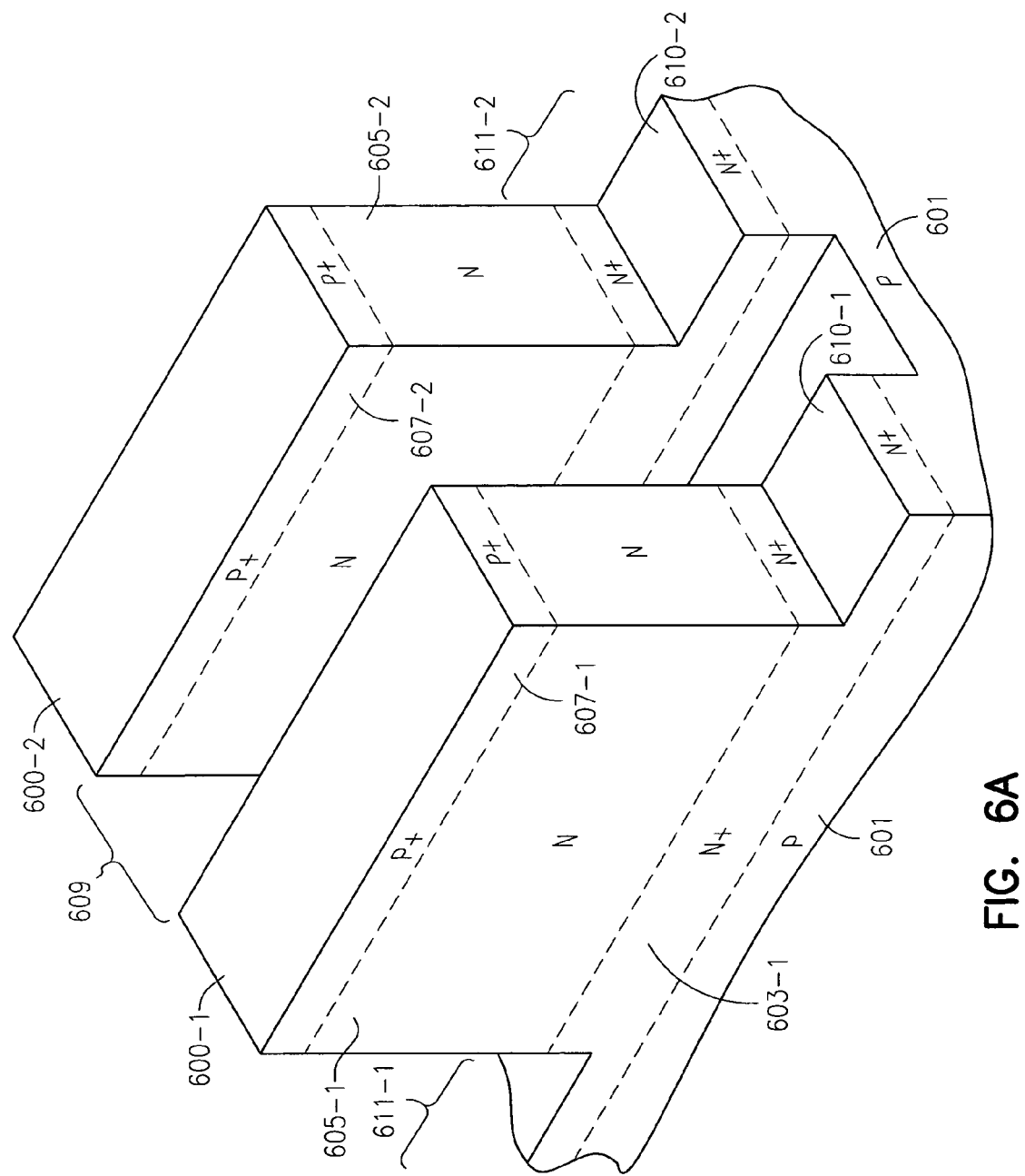
FIGS. 6A–6B illustrate an embodiment for fabricating vertical gain cells.
Figure 6B:
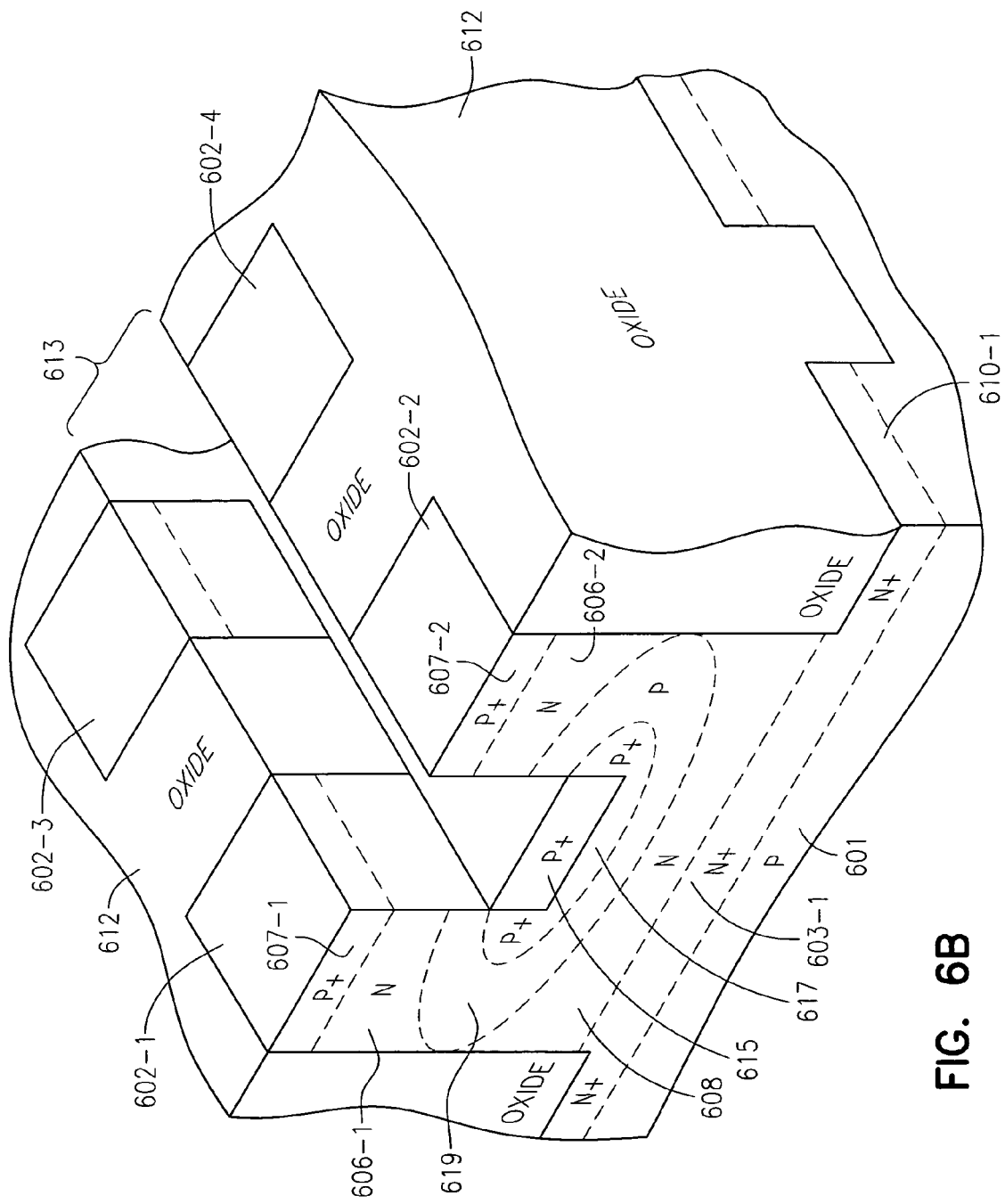

FIGS. 6A–6B illustrate an embodiment for fabricating vertical gain cells that includes forming a vertical sense MOS transistor having a floating body merged with a second vertical MOS transistor. In the embodiment of FIGS. 6A–6B, the vertical sense MOS transistor and the merged second vertical MOS transistor are formed on a semiconductor wafer having a p-type substrate 601 with a heavily doped n-type layer 610-1, 610-2 on the p-type substrate 601, an n-type layer 605-1, 605-2 disposed above the heavily doped n-type layer 610-1, 610-2, and a heavily doped p-type layer 607-1, 607-2 on the n-type layer 605-1, 605-2. The wafer may be silicon or other semiconductor material. The wafer is oxidized and then a silicon nitride layer (not shown) is deposited to act as an etch mask for an anisotropic or directional silicon etch which will follow. This nitride mask and underlying oxide are patterned and trenches 609, 611-1, 611-2 are etched as shown in both directions leaving blocks of silicon, e.g. 600-1, 600-2, having layers of n and p type conductivity material as shown in FIG. 6A. A number of such blocks can be formed on the wafer. In the embodiment of FIG. 6A, two masking steps are used and one set of trenches, e.g. trench 609, is made deeper than the other, e.g. trench 611-1, 611-2 in order to provide separation and isolation of write data/bit lines 610-1, 610-2.

FIG. 6B illustrates an etch for a read data word line trench 613 and deposition of a heavily doped p-type polysilicon source line 615 at the bottom of the etched trench 613. Moving from FIG. 6A to FIG. 6B, trenches 609, 611-1, 611-2 are filled with oxide 612 and the whole structure is planarized such as by chemical mechanical planarization (CMP). In an embodiment, oxide 612 includes silicon dioxide. In another embodiment, another insulator material is used in place of oxide 612.

Another nitride mask is deposited (not shown) and patterned to expose the center of blocks 601-1, 601-2 to another anisotropic or directional silicon etch to provide a space for the read data word lines. Such an etch forms silicon pillars 602-1-602-4 that form the basis for four vertical gain cells. This center trench 613 is filled with heavily doped p-type polysilicon and the whole structures planarized by CMP. The polysilicon in the center trench is recessed to a level below the top of the planar structure to form source line 615, and heat treated to dope the central portion of silicon pillars 602-1-602-4 as a heavily doped p-type region 617 and a doped p-type region 619, as shown in FIG. 6B, where the diffusion of the dopants is sufficient to lightly dope the opposite sides of silicon pillars 602-1-602-4. Heavily doped p-type region 617 forms the regions 413-1, 413-2 of FIG. 4C and doped p-type region 619 forms the regions 411-1, 411-2 of FIG. 4C, for two vertical gain cells coupled to the same write data/bit line. Now n-type layer 605-1 of FIG. 6A has a restructured form as n-type layer 608, p-type layer 619 encircling p+-layer 617 coupled to source line 615, and n-type layer 606-1, 606-2. In an embodiment, an n+ layer 603-1 is formed between n-type layer 608 and n+ write data/bit line 610-1.

In another embodiment, blocks 602-1, 602-2 forming two vertical gain memory cells having common regions 617, 619, and 608 are formed with these regions divided, i.e., each pair of regions 413-1 and 413-2, 411-1 and 411-2, and 419-1 and 419-2 of the completed structure as shown in FIG. 4A are separated by an insulating region. For instance, in an embodiment, an oxide, such as silicon dioxide, separates these regions.

Portions of oxide 612 are removed to form trenches for the write data word lines shown in FIG. 4C. The remaining structure as shown in FIG. 4C can be realized by conventional techniques including gate oxidation and two depositions and anisotropic etches of polysilicon along the sidewalls to form read data word lines and write data word lines. Read data/bit lines formed on top of the vertical gain cells, e.g. 417 of FIG. 4C, can be realized using conventional metallurgy.

As one of ordinary skill in the art will appreciate upon reading this disclosure, the vertical gain cells 401-1, 401-2 of FIGS. 4A–C, which may be formed an embodiment as illustrated in FIGS. 6A–B including a vertical MOS sense transistor 402-1, 402-2 having a floating body 409-1, 409-2 merged with a second vertical MOS transistor 404-1, 404-2, can provide a very high gain and amplification of the stored charge on the floating body 409-1, 409-2 of the MOS sense transistor 402-1, 402-2. For a PMOS vertical sense transistor, a small change in the threshold voltage caused by charge stored on the floating body 409-1, 409-2 will result in a large difference in the number of holes conducted between the drain 403-1, 403-2 and source 405-1, 405-2 of the PMOS sense transistor 402-1, 402-2 during the read data operation. This amplification allows the small storage capacitance of the sense amplifier floating body 409-1, 409-2 to be used instead of a large stacked capacitor storage capacitance. The resulting cell 401-1, 401-2 has a very high density with a cell area of $4F^2$, where F is the minimum feature size, and whose vertical extent is far less than the total height of a stacked capacitor or trench capacitor cell and access transistor. Additionally, the configuration and operation of these vertical gain cells avoids damaging reliability factors associated with cells using avalanche breakdown for gain and amplification.

While the description has been given for a p-type substrate, another embodiment uses n-type or silicon-on-insulator substrates. In such an embodiment, the sense transistor 402-1 (402-2) would be a NMOS transistor with a p-type floating body 409-1 (409-2) with an n+-type drain 403-1 (403-2) and a n-type source 405-1 (405-2), where n-type source 405-1 (405-2) has an n-type region 411-1 (411-2) encircling an n+-type region 413-1 (413-2) coupled to a n+-type source line 415. In an embodiment of this configuration, the second vertical transistor merged with the NMOS sense transistor 402-1 (402-2) would be a PMOS vertical transistor with a n-type body 411-1 (411-2) between a p-type drain 409-1 (409-2), merged with floating body 409-1 (409-2) of the NMOS sense transistor 402-1 (402-2), and a p-type source 419-1 (419-2). In an embodiment, p-type source 419-1 (419-2) is disposed on or above a p+-type write data/bit line 415 formed on the n-type or silicon-on-insulator substrate.

CONCLUSION

The vertical gain cell provides a high gain and amplification of a stored charge with a configuration including a vertical sense MOS transistor having a floating body merged with a second vertical MOS transistor. The vertical sense MOS transistor and the second vertical MOS transistor are of opposite type, i.e., one is a PMOS transistor and the other is an NMOS transistor. Addressing the second vertical MOS transistor changes a potential of the floating body of the vertical sense MOS transistor. A small change in the threshold voltage caused by charge stored on the floating body results in a large difference in the number of carriers conducted between the drain and source of the vertical sense transistor during the read data operation. This amplification allows the small storage capacitance of the sense amplifier floating body to be used instead of a large stacked capacitor storage capacitance. The resulting cell has a very high density with a cell area of $4F^2$, where F is the minimum feature size. Further, the configuration for operating these vertical gain cells avoids damaging reliability factors associated with cells using avalanche breakdown for gain and amplification.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present subject matter. It is to be understood that the above description is intended to be illustrative, and not restrictive. Combinations of the above embodiments, and other embodiments will be apparent to those of skill in the art upon reviewing the above description. The scope of the present subject matter includes any other applications in which the above structures and fabrication methods are used. The scope of the present subject matter should be determined with reference to the appended claims, along with the full scope of equivalents to which such claims are entitled.

What is claimed is:

1. A method of forming an electronic device having a vertical gain cell comprising:
   forming a first vertical MOS transistor having a floating body; and
   forming a second vertical MOS transistor merged with the first vertical MOS transistor, and
   coupling the second vertical MOS transistor to a conductive line such that addressing the second vertical MOS transistor couples the floating body to the conductive line.

2. The method of claim 1, wherein the method further includes forming a drain region for the second vertical MOS transistor merged with at least a portion of the floating body of the first vertical MOS transistor.

3. The method of claim 2, wherein the method further includes forming a body region for the second vertical MOS transistor merged with at least a portion of a source region of the first vertical MOS transistor.

4. The method of claim 3, wherein the method further includes forming a heavily doped source line coupled to the source region of the first vertical MOS transistor.

5. The method of claim 1, wherein the method further includes forming a write data word line coupled to a gate of the second vertical MOS transistor.

6. The method of claim 1, wherein the method further includes forming a read data/bit line coupled to a drain region of the first vertical MOS transistor.

7. The method of claim 1, wherein the method further includes forming a read data word line coupled to a gate of the first vertical MOS transistor.

8. The method of claim 1, wherein the method further includes forming the vertical gain cell on a p-type substrate.

9. The method of claim 1, wherein forming the first vertical MOS transistor includes forming a p-channel MOS (PMOS) transistor.

10. The method of claim 1, wherein forming the second vertical MOS transistor includes forming an n-channel MOS (NMOS) transistor.

11. The method of claim 1, wherein the method further includes forming the vertical gain cell on an n-type substrate or a SOI substrate.

12. The method of claim 1, wherein forming the first vertical MOS transistor includes forming an n-channel MOS (NMOS).

13. The method of claim 1, wherein forming the second vertical MOS transistor includes forming a p-channel MOS (PMOS) transistor.

14. The method of claim 1, wherein forming a second vertical MOS transistor merged with the first vertical MOS transistor includes forming the vertical gain cell with an area of approximately $4F^2$, where F is a minimum feature size.

15. The method of claim 1, wherein forming the electronic device having a vertical gain cell includes forming the electronic device having a vertical gain cell in a memory.

16. The method of claim 1, wherein forming the electronic device having a vertical gain cell includes forming the electronic device having a vertical gain cell in an electronic apparatus.

17. A method of forming a memory comprising:
forming a number of read data word lines;
forming a number of write data word lines;
forming a number of write data/bit lines; and
forming a number of vertical gain memory cells, each vertical memory cell coupled to one of the number of read data word lines and one of the write data word lines, wherein forming each vertical gain memory cell includes:
  forming a first vertical MOS transistor having a floating body; and
  forming a second vertical MOS transistor merged with the first vertical MOS transistor, and
  coupling the second vertical MOS transistor to a write data/bit line such that addressing the second vertical MOS transistor operatively couples the floating body to the write data/bit line.

18. The method of claim 17, wherein the method further includes forming a drain region for the second vertical MOS transistor merged with at least a portion of the floating body of the first vertical MOS transistor.

19. The method of claim 17, wherein the method further includes forming a body region for the second vertical MOS transistor merged with at least a portion of a source region of the first vertical MOS transistor.

20. The method of claim 17, wherein the method further includes:
forming a number of read data/bit lines;
coupling a read data/bit line to a drain region of the first vertical MOS transistor; and
coupling a source line to a source region of the first vertical MOS transistor.

21. The method of claim 17, wherein forming each vertical gain memory cell further includes forming the second vertical MOS transistor merged with the first vertical MOS transistor configured as a vertical gain memory cell having an area of approximately $4F^2$, where F is a minimum feature size.

22. The method of claim 17, wherein forming each vertical gain memory cell further includes forming the vertical gain memory cell on a p-type substrate and forming the first vertical MOS transistor as a p-channel MOS (PMOS) transistor.

23. The method of claim 17, wherein forming each vertical gain memory cell further includes forming the vertical gain memory cell on an n-type substrate or a SOI substrate and forming the first vertical MOS transistor as an n-channel MOS (NMOS).

24. The method of claim 17, wherein coupling the second vertical MOS transistor to a write data/bit line includes forming the second MOS transistor disposed on the write data/bit line.

25. The method of claim 24, wherein forming a number of read data/bit lines includes forming metallic read data/bit lines and forming a number of write data/bit lines includes forming a heavily doped n-type layer on a p-type substrate.

26. The method of claim 17, wherein the method further includes forming a heavily doped p-type polysilicon source line, wherein forming the number of read data word lines and the number of write data word lines includes forming polysilicon read data word lines and polysilicon write data word lines.

27. A method of forming an electronic apparatus comprising:
providing a processor; and
coupling the processor to a memory, the memory formed by a method including:
  forming a number of read data word lines;
  forming a number of write data word lines;
  forming a number of write data/bit lines; and
  forming a number of vertical gain memory cells, each vertical memory cell coupled to one of the number of read data word lines and one of the write data word lines, wherein forming each vertical gain memory cell includes:
    forming a first vertical MOS transistor having a floating body; and
    forming a second vertical MOS transistor merged with the first vertical MOS transistor, and
    coupling the second vertical MOS transistor to a write data/bit line such that addressing the second vertical MOS transistor operatively couples the floating body to the write data/bit line.

28. The method of claim 27, wherein the method further includes forming a drain region for the second vertical MOS transistor merged with at least a portion of the floating body of the first vertical MOS transistor.

29. The method of claim 28, wherein the method further includes forming a body region for the second vertical MOS transistor merged with at least a portion of a source region of the first vertical MOS transistor.

30. The method of claim 27, wherein the method further includes:
forming a number of read data/bit lines;
coupling a read data/bit line to a drain region of the first vertical MOS transistor; and
coupling a source line to a source region of the first vertical MOS transistor.

31. The method of claim 27, wherein forming each vertical gain memory cell further includes forming the vertical gain memory cell having an area of approximately $4F^2$, where F is a minimum feature size.

32. The method of claim 27, wherein each vertical gain memory cell further includes forming the vertical gain memory cell on a p-type substrate and forming the first vertical MOS transistor as a p-channel MOS (PMOS) transistor.

33. The method of claim 27, forming each vertical gain memory cell further includes forming the vertical gain memory cell on an n-type substrate or a SOI substrate and forming the first vertical MOS transistor as an n-channel MOS (NMOS).

* * * * *